United States Patent
Shiraki et al.

(10) Patent No.: US 7,956,389 B2
(45) Date of Patent: Jun. 7, 2011

(54) SOLID-STATE IMAGING DEVICE, IMAGING APPARATUS, AND METHOD OF MANUFACTURING SOLID-STATE IMAGING DEVICE

(75) Inventors: Hirokazu Shiraki, Miyagi (JP); Katsumi Ikeda, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 186 days.

(21) Appl. No.: 12/234,138

(22) Filed: Sep. 19, 2008

(65) Prior Publication Data

US 2009/0078969 A1    Mar. 26, 2009

(30) Foreign Application Priority Data

Sep. 21, 2007 (JP) ................ P2007-245338

(51) Int. Cl.
*H01L 27/148* (2006.01)
*H01L 31/062* (2006.01)
*H01L 31/113* (2006.01)
*H04N 3/14* (2006.01)
*H04N 5/335* (2006.01)

(52) U.S. Cl. .......... 257/231; 257/292; 257/E27.15; 438/75; 438/78; 348/311; 348/315; 348/323; 348/249

(58) Field of Classification Search .......... 257/231, 257/292, E27.15; 438/75, 78; 348/311, 249, 348/315, 323
See application file for complete search history.

(56) References Cited

U.S. PATENT DOCUMENTS

| | | | |
|---|---|---|---|
| 4,689,687 A * | 8/1987 | Koike et al. | 348/322 |
| 6,288,744 B1 * | 9/2001 | Takahashi et al. | 348/311 |
| 6,441,853 B1 * | 8/2002 | Furumiya | 348/311 |
| 6,760,073 B1 * | 7/2004 | Nakashiba | 348/314 |
| 6,885,399 B1 * | 4/2005 | Kawashiri | 348/273 |
| 7,002,630 B1 | 2/2006 | Iizuka et al. | |
| 7,416,916 B2 * | 8/2008 | Watanabe | 438/75 |
| 7,491,923 B2 * | 2/2009 | Tani | 250/208.1 |
| 7,595,822 B2 * | 9/2009 | Sakamoto et al. | 348/230.1 |
| 2005/0110052 A1 * | 5/2005 | Konishi | 257/222 |
| 2005/0247933 A1 * | 11/2005 | Kanbe | 257/59 |
| 2006/0092304 A1 * | 5/2006 | Hirota | 348/311 |
| 2006/0164532 A1 * | 7/2006 | Ikeda | 348/311 |
| 2007/0086067 A1 * | 4/2007 | Suemoto et al. | 358/482 |

FOREIGN PATENT DOCUMENTS

| | | |
|---|---|---|
| JP | 11-234569 A | 8/1999 |
| JP | 2005-44850 A | 2/2005 |
| JP | 2007-027977 A | 2/2007 |

* cited by examiner

*Primary Examiner* — Zandra Smith
*Assistant Examiner* — Jeremy J Joy
(74) *Attorney, Agent, or Firm* — Birch, Stewart, Kolasch & Birch, LLP

(57) ABSTRACT

A solid-state imaging device includes: a semiconductor substrate; photoelectric conversion elements; vertical charge transfer paths that transfer charges generated in photoelectric conversion elements, in a vertical direction; a horizontal charge transfer path that transfers the charges transferred in vertical charge transfer paths, in a horizontal direction orthogonal to the vertical direction; a plurality of charge accumulating sections between the vertical charge transfer paths and the horizontal charge transfer path; a plurality of electrodes disposed above the respective charge accumulating sections, the plurality of electrodes being classified into a plurality of kinds of electrodes; wirings corresponding to the respective kinds of electrodes and extending in the horizontal direction above the plurality of electrodes; and a planarizing layer disposed between the wirings and an uneven surface caused by the plurality of electrodes that are present in areas overlapping the wirings, so as to planarize the uneven surface.

4 Claims, 6 Drawing Sheets

FIG. 3
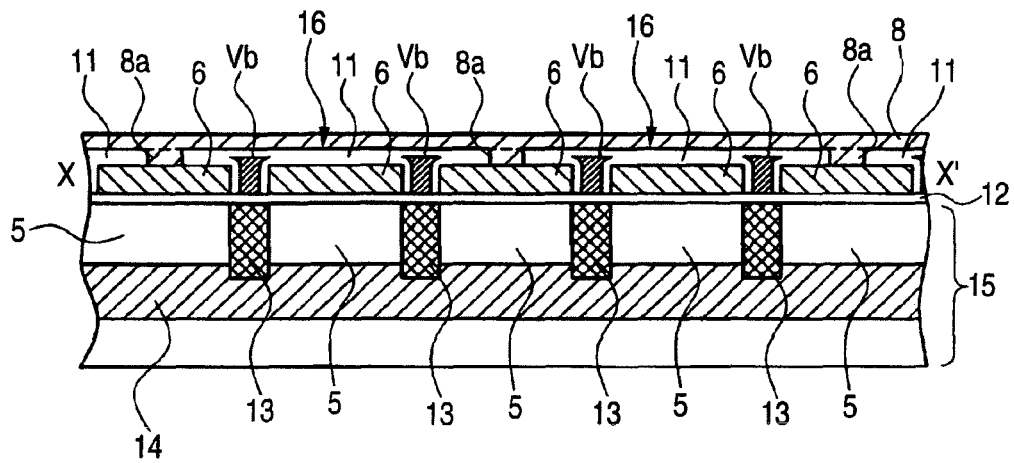
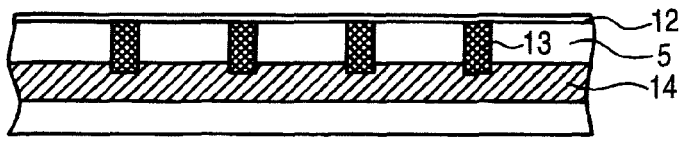
FIG. 4 (a)
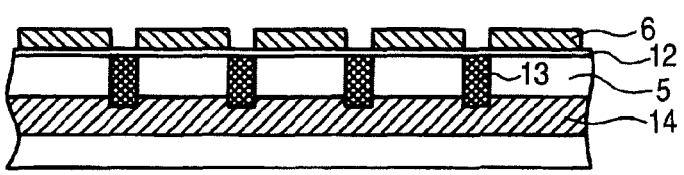
FIG. 4 (b)
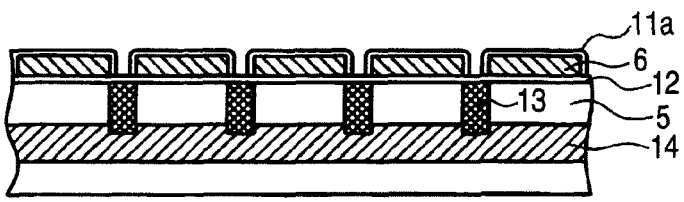
FIG. 4 (c)
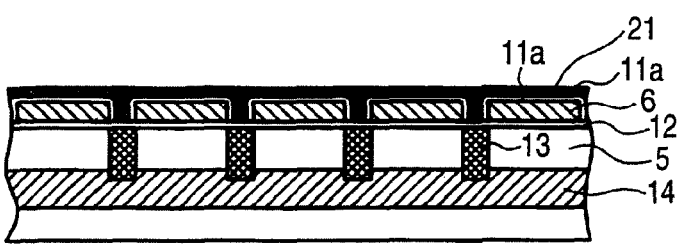
FIG. 4 (d)

US 7,956,389 B2

SOLID-STATE IMAGING DEVICE, IMAGING APPARATUS, AND METHOD OF MANUFACTURING SOLID-STATE IMAGING DEVICE

This application is based on and claims priority under 35 U.S.C. §119 from Japanese Patent Application No. 2007-245338 filed Sep. 21, 2007, the entire disclosure of which is herein incorporated by reference.

BACKGROUND OF THE INVENTION

1. Field of the Invention

The present invention relates to a solid-state imaging device having within a semiconductor substrate: photoelectric conversion elements; a plurality of vertical charge transfer paths for transferring charges generated in the photoelectric conversion elements, in a vertical direction; a horizontal charge transfer path for transferring the charges transferred in the plurality of vertical charge transfer paths, in a horizontal direction orthogonal to the vertical direction; and charge accumulating sections provided between the plurality of vertical charge transfer paths and the horizontal charge transfer path.

2. Description of Related Art

For a solid-state imaging device having within a semiconductor substrate: photoelectric conversion elements; a plurality of vertical charge transfer paths for transferring charges generated in the photoelectric conversion elements, in a vertical direction; a horizontal transfer path for transferring the charges transferred in the plurality of vertical charge transfer paths, in a horizontal direction orthogonal to the vertical direction; and charge accumulating sections (line memory) provided between the plurality of vertical charge transfer paths and the horizontal charge transfer path, a structure has been proposed in which two electrodes are provided above the charge accumulating sections (see JP-A-2007-27977 and JP-A-11-234569). According to this structure, by driving the two electrodes with a two-phase pulse, charges can be transferred to the horizontal charge transfer path every two charge accumulating sections arranged in the horizontal direction, so that the horizontal addition driving of the charge can easily be performed.

However, in the solid-state imaging devices disclosed in JP-A-2007-27977 and JP-A-11-234569, since the configuration is determined so that the two electrodes formed above the charge accumulating sections are alternately arranged every number of vertical charge transfer paths, the structure of the two electrodes is complicated, and electrode formation is not easy.

SUMMARY OF THE INVENTION

An object of the present invention is to provide a solid-state imaging device in which charge accumulating sections are provided between vertical charge transfer paths and a horizontal charge transfer path, a plurality of kinds of electrodes are provided above the charge accumulating sections, and the plurality of kinds of electrodes can easily be formed.

According to an aspect of the invention, there is provided a solid-state imaging device including: a semiconductor substrate; a plurality of photoelectric conversion elements; a plurality of vertical charge transfer paths that transfer charges generated in the plurality of photoelectric conversion elements, in a vertical direction; a horizontal charge transfer path that transfers the charges transferred in the plurality of vertical charge transfer paths, in a horizontal direction orthogonal to the vertical direction; a plurality of charge accumulating sections between the plurality of vertical charge transfer paths and the horizontal charge transfer path; a plurality of electrodes disposed above the respective charge accumulating sections, the plurality of electrodes being classified into a plurality of kinds of electrodes; wirings corresponding to the respective kinds of electrodes and extending in the horizontal direction above the plurality of electrodes; and a planarizing layer disposed between the wirings and an uneven surface caused by the plurality of electrodes that are present in areas overlapping the wirings, so as to planarize the uneven surface.

In the solid-state imaging device, the planarizing layer may include: a conductive material filled in gaps between the electrodes; and an insulating material formed around the electrodes and the conductive material.

In the solid-state imaging device, the conductive material may be the same as a material of an electrode disposed above the vertical charge transfer paths and supplying a pulse to the vertical charge transfer paths.

In the solid-state imaging device, the planarizing layer may have openings disposed above portions overlapping the wirings with the corresponding kinds of electrodes, and the wirings are electrically connected to the corresponding kinds of electrode at the openings.

According to an aspect of the invention, there is provided an imaging apparatus including the above-described solid-state imaging device.

According to an aspect of the invention, there is provided a method of manufacturing a solid-state imaging device that includes: a semiconductor substrate; a plurality of photoelectric conversion elements; a plurality of vertical charge transfer paths that transfer charges generated in the plurality of photoelectric conversion elements, in a vertical direction; a horizontal charge transfer path that transfers the charges transferred in the plurality of vertical charge transfer paths, in a horizontal direction orthogonal to the vertical direction; and a plurality of charge accumulating sections between the plurality of vertical charge transfer paths and the horizontal charge transfer path. The method includes: forming a plurality of electrodes above the respective charge accumulating sections; classifying the plurality of electrodes into a plurality of kinds of electrodes and forming wirings that correspond to the respective kinds of electrodes and extend in the horizontal direction above the plurality of electrodes; and forming, before forming of the wirings, a planarizing layer for planarizing an uneven surface formed by the plurality of electrodes that are present at least in areas where the wirings are to be formed above the semiconductor substrate. The forming of wirings includes: forming openings in the planarizing layer above portions overlapping the areas where the wirings are to be formed with the kinds of electrodes corresponding to the wirings; and forming a film of a conductive material on the planarizing layer where the openings are formed; and patterning the conductive material so that the formed film of the conductive material is left in the areas where the wirings are to be formed.

BRIEF DESCRIPTION OF THE DRAWINGS

The features of the invention will appear more fully upon consideration of the exemplary embodiments of the inventions, which are schematically set forth in the drawings, in which:

FIG. 3 is a schematic cross-sectional view taken along line X-X' of FIG. 2;

FIGS. 4(a)-(d) are views for explaining a method of manufacturing the solid-state imaging device shown in FIG. 1;

DETAILED DESCRIPTION OF THE EXEMPLARY EMBODIMENTS

According to an aspect of the present invention, a solid-state imaging device can be provided in which charge accumulating sections are provided between vertical charge transfer paths and a horizontal charge transfer path, a plurality of kinds of electrodes are provided above the charge accumulating sections, and the plurality of kinds of electrodes can easily be formed.

Hereinafter, an exemplary embodiment of the present invention will be described with reference to the drawings.

Figure 1:
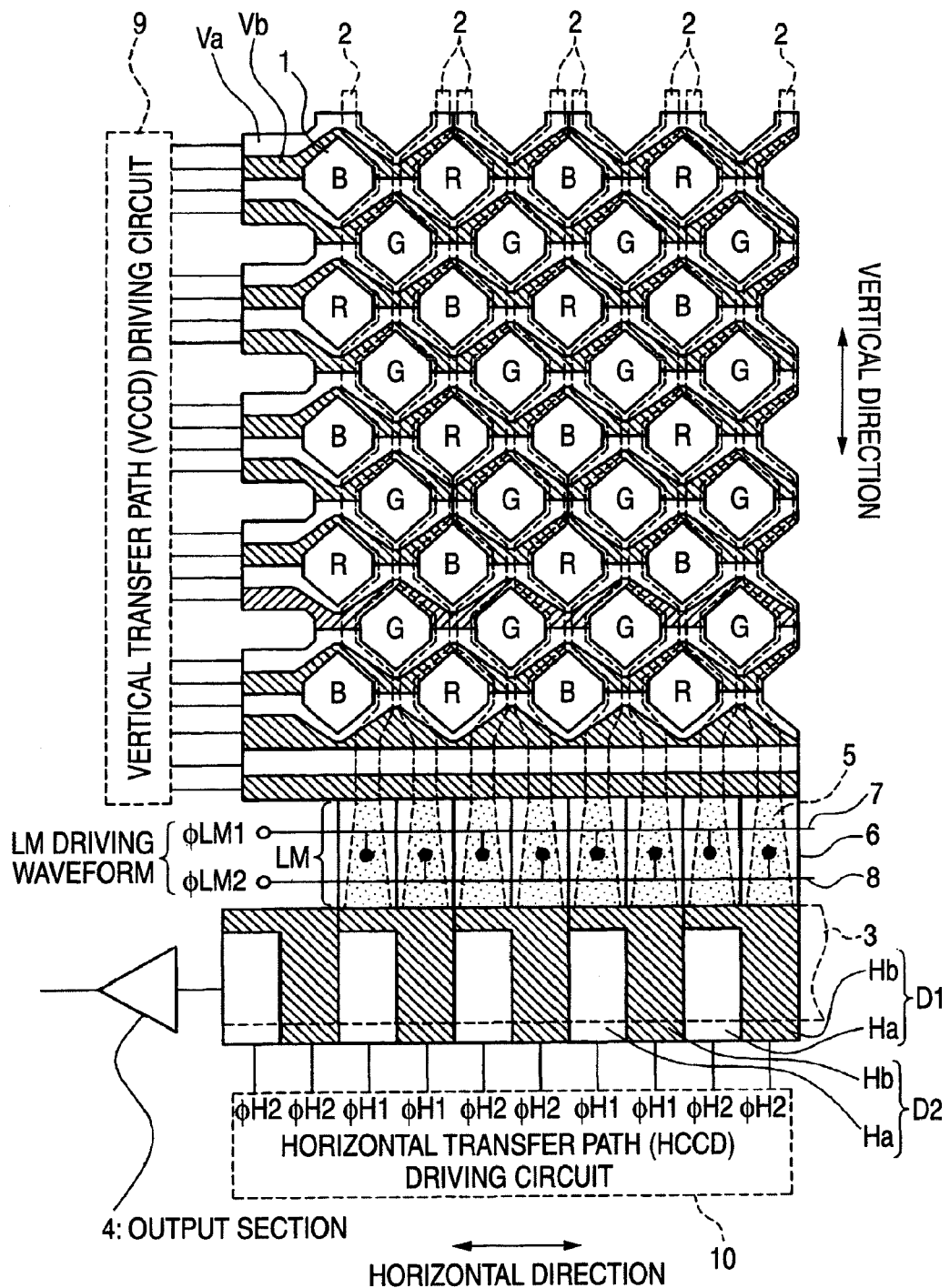
FIG. 1 is a schematic plan view showing a structure of a solid-state imaging device according to an exemplary embodiment of the present invention.
Figure 2:
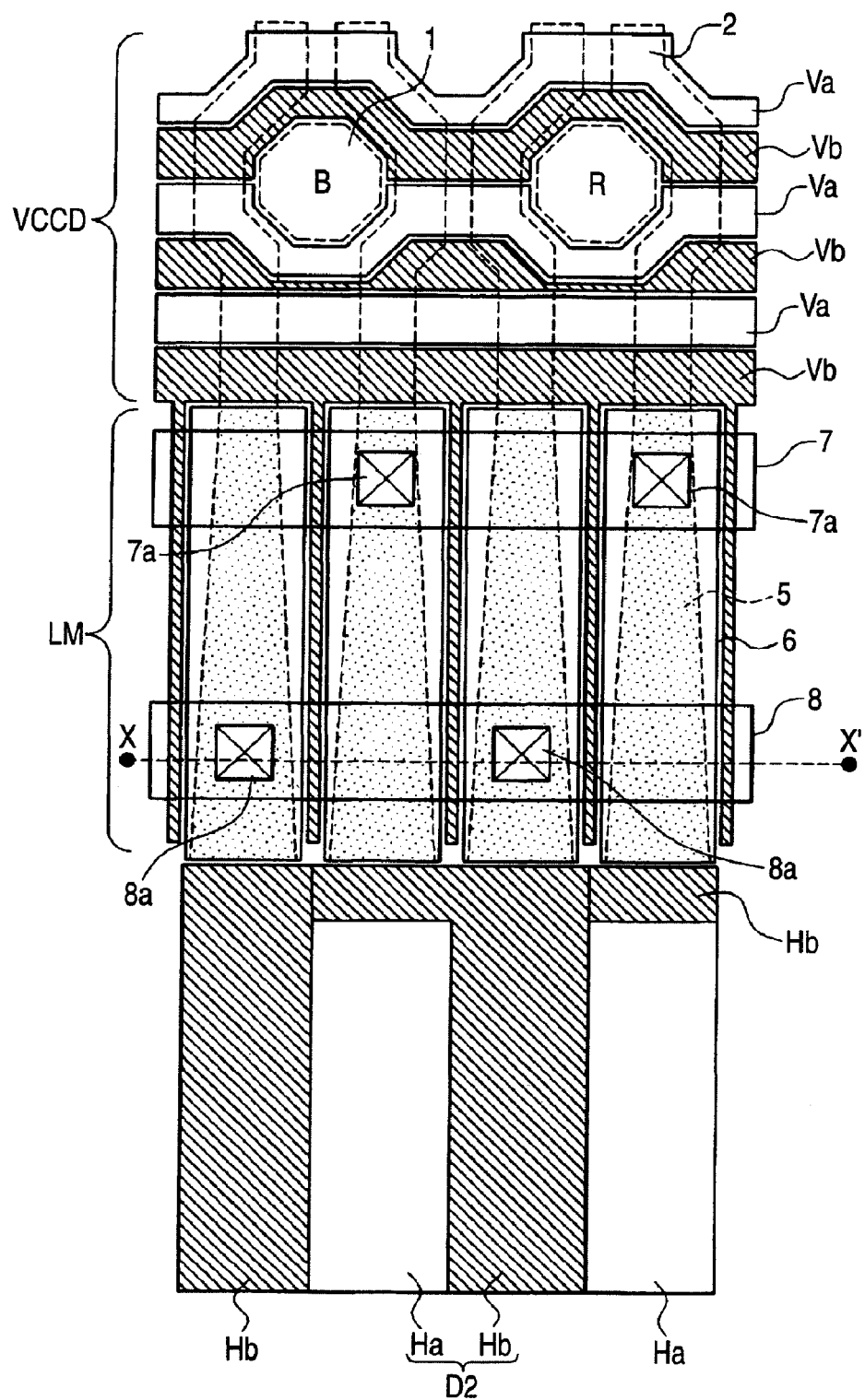
FIG. 2 is an enlarged view of the part of connection between vertical charge transfer paths and a horizontal charge transfer path of the solid-state imaging device shown in FIG. 1.

FIG. 1 is a schematic plan view showing the general structure of a solid-state imaging device according to an exemplary embodiment of the present invention. FIG. 2 is an enlarged view of the part of connection between vertical charge transfer paths and a horizontal charge transfer path of the solid-state imaging device shown in FIG. 1. FIG. 3 is a schematic cross-sectional view taken along line X-X' of FIG. 2. The solid-state imaging device of the present embodiment can be used in imaging apparatuses such as digital cameras and digital video cameras.

The solid-state imaging device shown in FIG. 1 includes: a large number of photoelectric conversion elements 1 two-dimensionally arranged in a vertical direction and a horizontal direction orthogonal thereto within a semiconductor substrate; a plurality of vertical charge transfer paths 2 for transferring charges generated in the photoelectric conversion elements 1, in the vertical direction; a horizontal charge transfer path 3 for transferring the charges transferred in the plurality of vertical charge transfer paths 2, in the horizontal direction; an output section 4 that converts the charges transferred in the horizontal charge transfer path 3 into a voltage signal and outputs the voltage signal; a line memory LM provided between the plurality of vertical charge transfer paths 2 and the horizontal charge transfer path 3 and including charge accumulating sections 5 that temporarily accumulate the charges transferred from the vertical charge transfer paths 2; a vertical transfer path driving circuit 9 that drives the vertical charge transfer paths 2; and a horizontal transfer path driving circuit 10 that drives the horizontal charge transfer path 3. The plurality of vertical charge transfer paths 2, the horizontal charge transfer path 3, and the charge accumulating sections 5 are formed within the semiconductor substrate.

The large number of photoelectric conversion elements 1 include three kinds of photoelectric conversion elements: R photoelectric conversion elements (marked with a letter "R" in FIG. 1) that detects red (R) light; G photoelectric conversion elements (marked with a latter "G" in FIG. 1) that detects green (G) light; and B photoelectric conversion elements (marked with a letter "B" in FIG. 1) that detects blue (B) light.

The arrangement of the large number of photoelectric conversion elements 1 is a so-called honeycomb arrangement in which a photoelectric conversion group in which the R photoelectric conversion elements 1 and the B photoelectric conversion elements 1 are arranged in square lattice form and a photoelectric conversion element group in which the G photoelectric conversion elements 1 are arranged in square lattice form are shifted from each other by ½ pitches of the photoelectric conversion element arrangement in the vertical direction and in the horizontal direction. A structure in which the photoelectric conversion elements 1 are arranged in square lattice form may be adopted.

The vertical charge transfer paths 2 are provided on the night side of photoelectric conversion element arrays including a plurality of photoelectric conversion elements 1 arranged in the vertical direction, in correspondence therewith, and transfer the charge generated in the photoelectric conversion elements 1 of the corresponding photoelectric conversion arrays, in the vertical direction.

Transfer electrodes Va formed of polysilicon as a first layer and transfer electrodes Vb formed of polysilicon as a second layer are alternately arranged in the vertical direction above the vertical charge transfer paths 2. A transfer pulse of, for example, eight phases is supplied to the transfer electrodes Va and the transfer electrodes Vb from the vertical transfer path driving circuit 9, whereby the charge transfer operation at the vertical charge transfer paths 2 is controlled.

A plurality of electrode groups in each of which a rectangular transfer electrode Ha formed of the first layer polysilicon and an inverted L shaped transfer electrode Hb formed of the second layer polysilicon are arranged in this order in the horizontal direction are arranged in the horizontal direction above the horizontal charge transfer path 3. These electrode groups include electrode groups D1 to which a transfer pulse φH2 is applied and electrode groups D2 to which a transfer pulse φH1 is applied, and these are alternately arranged in the horizontal direction. When the transfer pulse φH2 becomes high and the transfer pulse φH1 becomes low, the parts of the horizontal charge transfer path 3 under the electrode groups D1 operate as charge accumulation areas capable of accumulating charges, and the parts of the horizontal charge transfer path 3 under the electrode groups D2 operate as barrier areas between the charge accumulation areas. On the other hand, when the transfer pulse φH2 becomes low and the transfer pulse φH1 becomes high, the parts of the horizontal charge transfer path 3 under the electrode group D2 operate as the charge accumulation areas capable of accumulating charges, and the parts of the horizontal charge transfer path 3 under the electrode groups D1 operate as the barrier areas between the charge accumulation areas. As described above, in the horizontal charge transfer path 3, the electrode group D1 and the electrode group D2 constitute a plurality of charge transfer stages that operate as the barrier areas or the charge accumulation areas according to the level of the applied voltage.

The line memory LM includes charge accumulating sections 5 as many (a number, n) as the vertical charge transfer paths 2 and LM electrodes 6 provided above the number, n, of charge accumulating sections 5 so as to correspond thereto. The LM electrodes 6 are classified into two kinds of first LM electrodes to which a driving pulse φLM1 is applied and second LM electrodes to which a driving pulse φLM2 is applied. The first LM electrodes and the second LM electrodes are alternately arranged in the horizontal direction. Of the number, n, of charge accumulating sections 5, two adjoining charge accumulating sections 5 are connected to one charge transfer stage of the horizontal charge transfer path 3.

Above the number, n, of LM electrodes 6, a wiring 7 and a wiring 8 extending in the horizontal direction are formed so as to be aligned in the vertical direction. The wiring 7 is provided so as to correspond to the odd-numbered LM electrodes 6 that are, of the number, n, of LM electrodes 6, counted from the side closer to the output section 4. By protruding portions 7a coming in contact with the odd-numbered LM electrodes 6, electric connection with the odd-numbered LM electrodes 6 is made. The wiring 8 is provided so as to correspond to the even-numbered LM electrodes 6 that are, of the number, n, of LM electrodes 6, counted from the side closer to the output section 4. By protruding portions 8a coming in contact with the even-numbered LM electrodes 6, electric connection with the even-numbered LM electrodes 6 is made.

The driving pulse $\phi$LM1 is applied to the wiring 7, and the driving pulse $\phi$LM2 is applied to the wiring 8. The driving pulses $\phi$LM1 and $\phi$LM2 assume high state and low state. The wiring 7 and the wiring 8 are formed of a conductive material such as aluminum.

As described above, the number, n, of LM electrodes 6 include two kinds of LM electrodes: the first LM electrodes to which the wiring 7 is connected; and the second LM electrodes to which the wiring 8 is connected.

As shown in FIG. 3, a p-well layer 14 is formed in the surface of an n-type silicone substrate 15, and the number, n, of charge accumulating sections 5 formed of an n-type impurity layer are formed from the surface to the inside of the p-well layer 14. Between the number, n, of charge accumulating sections 5, element isolation layers 13 formed of a p-type impurity layer are formed for isolating the charge accumulating sections 5 from each other.

Above the number, n, of charge accumulating sections 5, the LM electrodes 6 are formed with a gate insulator film 12 in between. An uneven surface is formed by the surfaces of the number, n, of LM electrodes 6 and the surface of the gate insulator film 12 between the LM electrodes 6, and a planarizing layer 16 that planarizes the uneven surface is formed on the uneven surface. The wiring 8 is formed on the planarizing layer 16. An opening is formed in the planarizing layer 16 above a part of the portion overlapping the wiring 8 with each of the kind of electrodes (the even-numbered LM electrodes 6) corresponding to the wiring 8. The material of the wiring 8 is embedded in the openings, thereby forming the protruding portions 8a of the wiring 8.

Parts of the transfer electrode Vb, closest to the horizontal charge transfer path 3, of the transfer electrodes Va and Vb provided above the vertical transfer paths 2 are embedded in the gaps between the LM electrodes 6. The planarizing layer 16 is formed of the parts of the transfer electrode Vb and an insulating layer 11 formed around the parts of the transfer electrode Vb and the LM electrodes 6.

The cross-sectional view of the part under the wiring 7 is such that in the schematic cross-sectional view shown in FIG. 3, the position of the opening provided in the planarizing layer 16 is above a part of the portion overlapping the wiring 7 with each of the kind of electrodes corresponding to the wiring 7 (the odd-numbered LM electrodes 6), and the wiring material is embedded in the openings to thereby form the protruding portions 7a of the wiring 7.

The operation of the solid-state imaging device structured as described above will be described.

The operation up to the transfer, of the charge read from the photoelectric conversion elements 1, to the number, n, of charge accumulating sections 5 is the same as the operation in the related art. Under a condition where the charge obtained from two lines of photoelectric conversion elements 1 of the solid-state imaging device is accumulated in the number, n, of charge accumulating sections 5, $\phi$H1 and $\phi$H2 are low, $\phi$LM1 and $\phi$LM2 are high, a voltage well is formed in the charge accumulating sections 5, and the charge transfer stages of the horizontal charge transfer path 3 constitute the barrier of the voltage well.

Then, the $\phi$LM2 is made low and the $\phi$H2 is made high, whereby to the charge transfer stages under the electrode groups D1, the charge that is present in the charge accumulating sections 5 under the LM electrodes 6, connected to the wiring 8, of the LM electrodes 6 corresponding to the charge transfer stages is moved. Thereafter, the $\phi$H2 is made low and $\phi$H1 is made high to thereby transfer the charge to the next charge transfer stages. By repeating this transfer operation, a signal corresponding to the charge is outputted from the output section 4.

Then, after making $\phi$H1 and $\phi$H2 low and making $\phi$LM1 and $\phi$LM2 high, $\phi$LM1 is made low and $\phi$H2 is made high, whereby to the charge transfer stages under the electrode groups D1, the charge that is present in the charge accumulating sections 5 under the LM electrodes 6, connected to the wiring 7, of the LM electrodes 6 corresponding to the charge transfer stages is moved. Thereafter, $\phi$H2 is made low and $\phi$H1 is made high to thereby transfer the charge to the next charge transfer stages. By repeating this transfer operation, a signal corresponding to the charge is outputted from the output section 4.

Then, after making $\phi$H1 and $\phi$H2 low and making $\phi$LM1 and $\phi$LM2 high, $\phi$LM2 is made low and $\phi$H1 is made high, whereby to the charge transfer stages under the electrode groups D2, the charge that is present in the charge accumulating sections 5 under the LM electrodes 6, connected to the wiring 8, of the LM electrodes 6 corresponding to the charge transfer stages is moved. Thereafter, $\phi$H1 is made low and $\phi$H2 is made high to thereby transfer the charge to the next charge transfer stages. By repeating this transfer operation, a signal corresponding to the charge is outputted from the output section 4.

Then, after making $\phi$H1 and $\phi$H2 low and making $\phi$LM1 and $\phi$LM2 high, $\phi$LM1 is made low and $\phi$H1 is made high, whereby to the charge transfer stages under the electrode groups D2, the charge that is present in the charge accumulating sections 5 under the LM electrodes 6, connected to the wiring 7, of the LM electrodes 6 corresponding to the charge transfer stages is moved. Thereafter, $\phi$H1 is made low and $\phi$H2 is made high to thereby transfer the charge to the next charge transfer stages. By repeating this transfer operation, a signal corresponding to the charge is outputted from the output section 4.

By this operation, the transfer of two lines of charge is completed.

Next, a method of manufacturing the solid-state imaging device structured as described above will be described.

Figure 5:
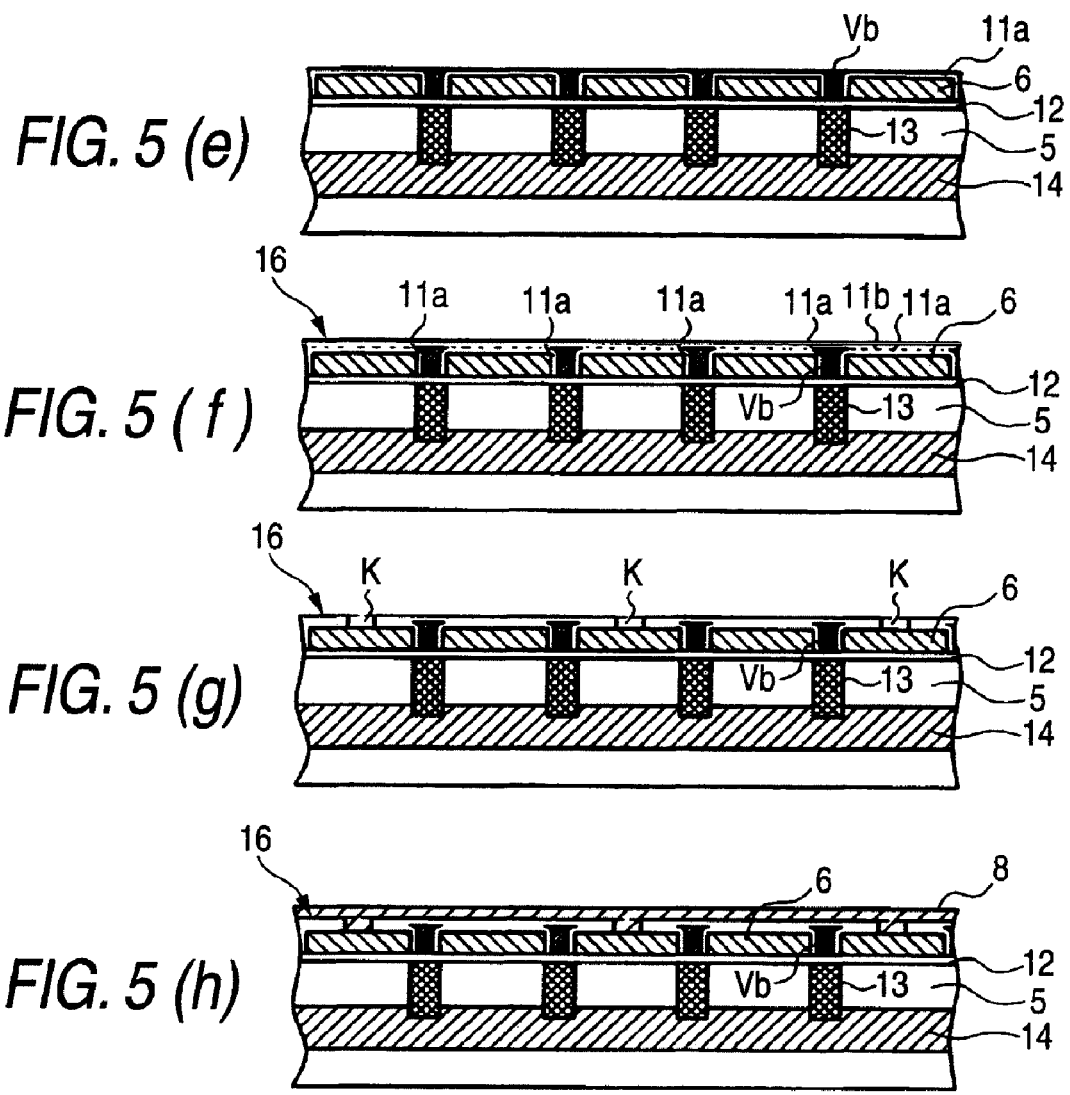
FIGS. 5(e)-(h) are views for explaining the method of manufacturing the solid-state imaging device shown in FIG. 1.

FIGS. 4 and 5 are views for explaining the method of manufacturing the solid-state imaging device shown in FIG. 1, and are schematic cross-sectional views taken along line X-X' of FIG. 2 in the manufacturing steps.

First, the gate insulator film 12 is formed on the semiconductor substrate by a known process, and the elements within the semiconductor substrate (the photoelectric conversion elements 1, the vertical charge transfer paths 2, the horizontal charge transfer path 3, the p-well layer 14, the charge accumulating sections 5, the device isolation layers 13, etc.) are formed (FIG. 4(a)). Then, a film of a conductive material (for example, polysilicon) is formed on the gate insulator film 12, and patterning is performed thereon, thereby forming the transfer electrodes Va, the LM electrodes 6, and the transfer electrodes Ha (FIG. 4(*b*)). Under the condition shown in FIG. 4(*b*), the uneven surface is formed on the surface of the semiconductor substrate by the LM electrodes 6.

Then, an insulator film 11*a* is formed around the transfer electrodes Va, the LM electrodes 6, and the transfer electrodes Ha by thermal oxidation, CVD, or the like (FIG. 4(*c*)). Then, a film of a conductive material 21 (for example, polysilicon) is formed on the insulator film 11*a* (FIG. 4(*d*)), patterning is performed thereon so that the conductive material 21 is left in the positions where the transfer electrodes Vb and Hb are formed (above the vertical transfer paths 2, the gaps between the LM electrodes 6, and above the horizontal charge transfer path 3), and the patterned conductive material 21 is planarized so that the insulator film 11*a* is exposed. The conductive material 21 that is left by the planarizing step serves as the transfer electrodes Vb and Hb (FIG. 5(*e*)).

Next, an insulator film 11*b* is formed on the insulator film 11*a* and the transfer electrodes Vb by thermal oxidation, CVD, or the like in order to insulate the transfer electrodes Vb between the LM electrodes 6 (FIG. 5(*f*)). The insulator film 11*b* which is formed on a flat surface is flat itself. Consequently, the insulator film 11*b*, the insulator film 11*a*, and the transfer electrodes Vb between the LM electrodes 6 constitute the planarizing layer 16 that planarizes the uneven surface shown in FIG. 4(*b*).

Then, an opening K is formed, by etching, in the planarizing layer 16 on a part of the portion overlapping the area where the wiring 7 is to be formed, with each of the kind of electrodes corresponding to the wiring 7 (the odd-numbered LM electrodes 6) and in the planarizing layer 16 on a part of the portion overlapping the area where the wiring 8 is to be formed, with each of the kind of electrodes corresponding to the wiring 8 (the even-numbered LM electrodes 6) (FIG. 5(*g*)). Then, a film of a conductive material (for example, aluminum) is formed on the planarizing layer 16, and patterning is performed on the conductive material so that the formed film of the conductive material is left in the areas where the wirings 7 and 8 are to be formed, thereby forming the wirings 7 and 8 (FIG. 5(*h*)).

As described above, in the solid-state imaging device of the present embodiment, since the wirings 7 and 8 are formed on the planarizing layer 16, the lengths of the wirings 7 and 8 can be prevented from being increased. This effect of wiring length reduction will be described in detail.

Figure 6:
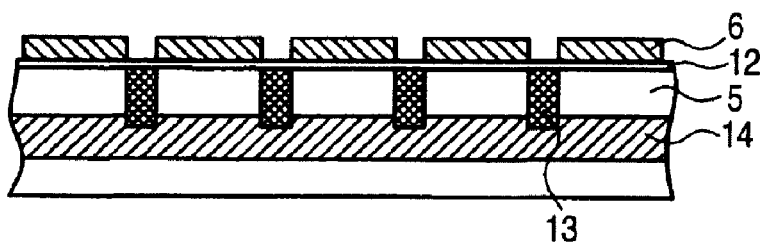
FIGS. 6(a)-(d) are process drawings of a case where a solid-state imaging device is manufactured by a method different from the above-described manufacturing method.
Figure 6:
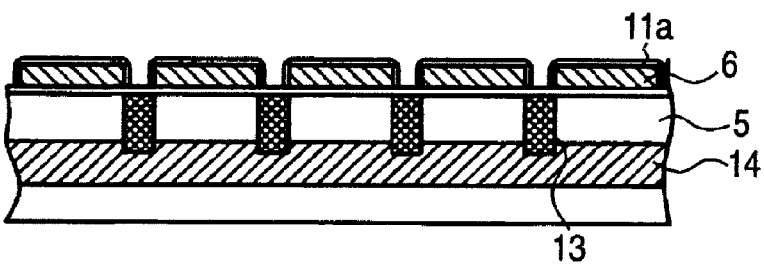
Figure 6:
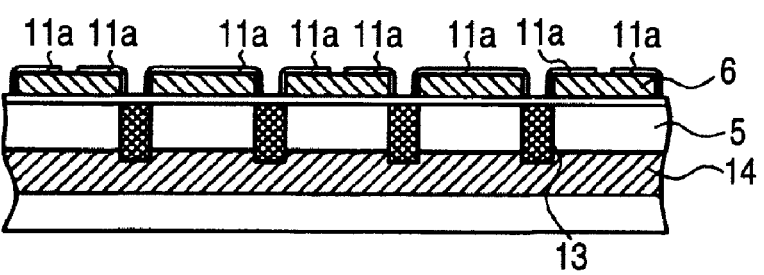
Figure 6:
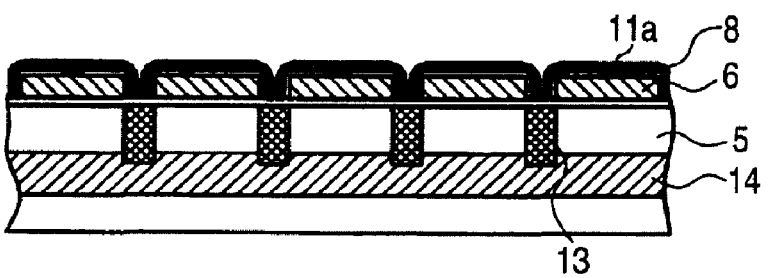

FIG. 6 is a process drawing of a case where a solid-state imaging device is manufactured by a method different from the above-described manufacturing method.

FIGS. 6(*a*) and 6(*b*) are the same drawings as FIGS. 4(*b*) and 4(*c*). After the device of the condition shown in FIG. 6(*b*) is formed by the above-described method, a film of a conductive material is formed, patterning is performed thereon to thereby form the transfer electrodes Vb and the transfer electrodes Hb, and an insulator film is formed around the transfer electrodes Vb and the transfer electrodes Hb by thermal oxidation or CVD. Then, as shown in FIG. 6(*c*), parts of the kind of LM electrodes 6 (the odd-numbered LM electrodes 6), corresponding to the wiring 7, of the LM electrodes 6 situated in the area where the wiring 7 is to be formed and parts of the kind of LM electrodes 6 (the even-numbered LM electrodes 6), corresponding to the wiring 8, of the LM electrodes 6 situated in the area where the wiring 8 is to be formed are exposed by forming openings, by etching, in the insulator film 11*a* on these parts. Then, a film of a conductive material is formed, and patterning is performed thereon to thereby form the wirings 7 and 8 (FIG. 6(*d*)).

Figure 7:
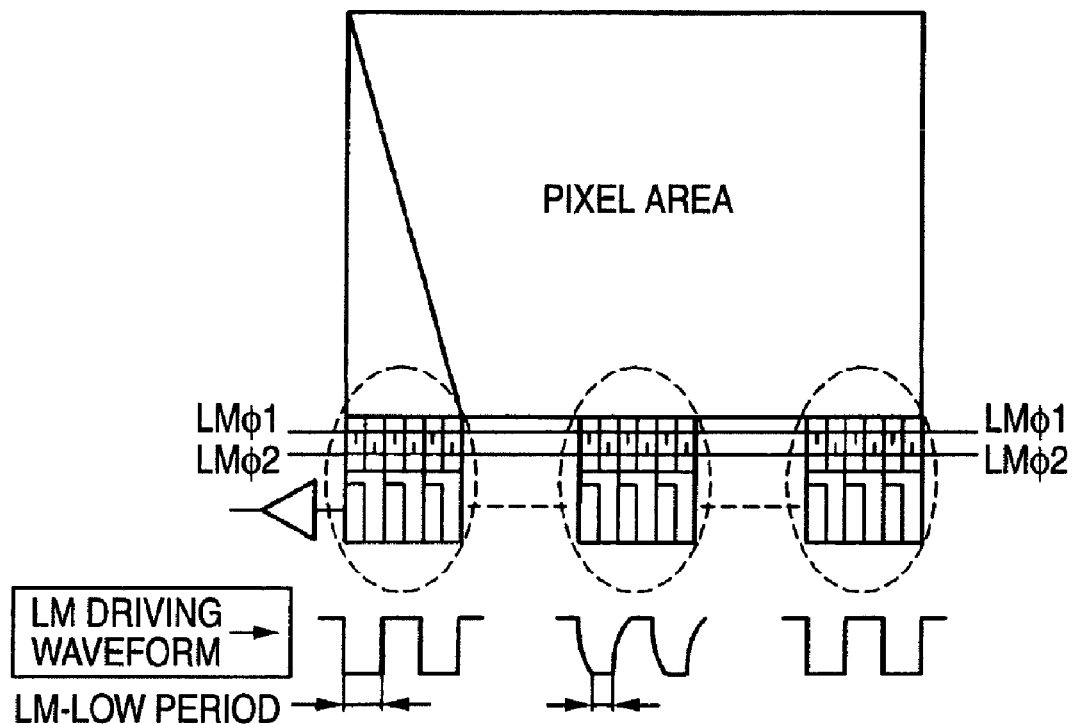
FIG. 7 is a view showing changes of driving pulses φLM1 and φLM2.

When this manufacturing method is adopted, the wirings 7 and 8 have a configuration reflecting the uneven surface formed by the LM electrodes 6 as shown in FIG. 6(*d*). Consequently, the lengths of the wirings 7 and 8 are longer than those of the structure shown in FIG. 3 because of the parts embedded in the gaps between the LM electrodes 6. Since the long wiring length increases the signal propagation delay, the LM driving pulses φLM1 and φLM2 become dull in the central part of the pixel area as shown in FIG. 7, so that the effective low period of the LM driving pulses φLM1 and φLM2 becomes short. Since the charge transfer from the line memory LM to the horizontal charge transfer path 3 is performed by making the LM driving pulses φLM1 and φLM2 low as described above, if the period during which the LM driving pulses φLM1 and φLM2 are low is shortened, the charge transfer from the line memory LM to the horizontal charge transfer path 3 can result in a failure.

On the contrary, according to the solid-state imaging device of the present embodiment, since the wirings 7 and 8 are formed on the planarizing layer 16 after the planarizing layer 16 that planarizes the uneven surface formed by the LM electrodes 6 is formed, the wirings 7 and 8 are never embedded in the gaps between the LM electrodes 6, so that the lengths of the wirings 7 and 8 can be made shorter than those of the device manufactured by the method shown in FIG. 5. Consequently, the signal propagation delays of the LM driving pulses φLM1 and φLM2 can be reduced, so that the possibility of occurrence of a charge transfer failure can be reduced.

Moreover, in the solid-state imaging device of the present embodiment, the planarizing layer 16 is constituted by: the insulator film 11*a* for insulating the LM electrodes 6, the transfer electrodes Va, and the transfer electrodes Ha; the insulator film 11*b* for insulating the transfer electrodes Vb and the transfer electrodes Hb; and the transfer electrodes Vb. These have conventionally been present, and when a single-layer electrode structure is adopted as the transfer electrodes, the step of planarizing the transfer electrodes Vb and the transfer electrodes Hb is also performed. For this reason, the solid-state imaging device of the present embodiment can be manufactured only by changing the mask pattern for the patterning of the transfer electrodes Vb without any new manufacturing step being added to the conventional manufacturing method. Consequently, a highly reliable solid-state imaging device can be manufactured at low cost.

Moreover, according to the solid-state imaging device of the present embodiment, since two vertical charge transfer paths 2 are connected to one charge transfer stage, the width, in the horizontal direction, of the charge transfer stages can be increased compared with the conventional structure in which one vertical charge transfer path 2 is connected to one charge transfer stage. Consequently, the charge transfer capacity of the horizontal charge transfer path 3 can be increased without any increase in power consumption. In addition, since the number of charge transfer stages can be reduced, transfer efficiency deterioration can be prevented.

Moreover, according to the solid-state imaging device of the present embodiment, since the number, n, of LM electrodes 6 include two kinds of the first LM electrodes and the second LM electrodes to which a voltage can be independently applied, charge distribution from the line memory LM to the horizontal charge transfer path 3 can be performed by controlling the driving pulses φLM1 and φLM2. In the structure where only the same voltage can be applied to the number, n, of LM electrodes 6, when multi-field reading is performed, the driving of the vertical charge transfer paths 2 is complicated. However, according to the structure shown in FIG. 1, multi-field reading can be realized only by controlling the driving pulses φLM1 and φLM2 without the driving of the vertical charge transfer paths 2 being complicated. Moreover, thinned-out driving and the like can easily be realized by controlling the driving pulses φLM1 and φLM2. As described above, by providing a plurality of kinds of LM electrodes 6, various driving methods can easily be realized.

Moreover, according to the solid-state imaging device of the present embodiment, since the LM electrodes 6 formed above the number, n, of charge accumulating sections 5, respectively, have a configuration in which a line memory electrode of a typical device having a line memory is merely divided into a number, n, of electrodes, the manufacturing process of the LM electrodes 6 is never complicated. Consequently, a solid-state imaging device capable of easily realizing various driving methods can be provided with manufacturing cost being suppressed.

While the number of kinds of LM electrodes included in the number, n, of LM electrodes 6 is two in the above description, it may be three or more. In this case, wirings corresponding to the kinds of LM electrodes are provided above the LM electrodes 6, and these wirings and their corresponding kinds of LM electrodes 6 are electrically connected.

Moreover, while the wirings 7 and 8 are connected to the LM electrodes 6 so that the first LM electrodes and the second LM electrodes are alternately arranged in the horizontal direction in the example of FIG. 1, the connection configuration is not limited thereto. For example, the wirings 7 and 8 may be connected to the LM electrodes 6 so that every two of the first LM electrodes and the second LM electrodes are alternately arranged in the horizontal direction.

While two vertical charge transfer paths 2 are connected to one charge transfer stage of the horizontal charge transfer path 3 in the example of FIG. 1, the related-art structure in which one vertical charge transfer path 2 is connected to one charge transfer stage of the horizontal charge transfer path 3 may be adopted.

While the planarizing layer 16 is formed in an area which is the sum of the areas above the LM electrodes 6 and the areas above the gaps between the LM electrodes 6 according to the above-described manufacturing method, to obtain the effect of reducing the lengths of the wirings 7 and 8, it is essential only that the planarizing layer 16 be present at least in, of the above-mentioned area, the areas where the wirings 7 and 8 are to be formed. That is, when patterning of the transfer electrodes Vb is performed, instead of leaving the conductive material in all the gaps between the LM electrodes 6, the conductive material may be left only in, of the gaps between the LM electrodes 6, the areas where the wirings 7 and 8 are to be formed.

While the transfer electrodes Vb are used as the member for filling the gaps between the LM electrodes 6 in the above-described manufacturing method, any material can be used as this member as long as it can fill the gaps between the LM electrodes 6. For example, this member my be an insulating material. When an insulating material is used, after the LM electrodes 6 and the transfer electrodes Ha, Hb, Va, and Vb are formed, the insulating material is filled at least in, of the areas between the LM electrodes 6, the area where the wirings 7 and 8 are to be formed, and the insulator film 11b is formed thereon and the planarizing layer 16 is formed.

What is claimed is:

1. A solid-state imaging device comprising:
   a semiconductor substrate;
   a plurality of photoelectric conversion elements;
   a plurality of vertical charge transfer paths that transfer charges generated in the plurality of photoelectric conversion elements, in a vertical direction;
   a horizontal charge transfer path that transfers the charges transferred in the plurality of vertical charge transfer paths, in a horizontal direction orthogonal to the vertical direction;
   a plurality of charge accumulating sections between the plurality of vertical charge transfer paths and the horizontal charge transfer path;
   a plurality of electrodes disposed above the respective charge accumulating sections, the plurality of electrodes being classified into a plurality of kinds of electrodes;
   wirings corresponding to the respective kinds of electrodes and extending in the horizontal direction above the plurality of electrodes; and
   a planarizing layer disposed between the wirings and an uneven surface caused by the plurality of electrodes that are present in areas overlapping the wirings, so as to planarize the uneven surface,
   wherein the planarizing layer includes a conductive material filled in gaps between the electrodes, and an insulating material formed around the electrodes and the conductive material.

2. The solid-state imaging device according to claim 1, wherein the conductive material is the same as a material of an electrode disposed above the vertical charge transfer paths and supplying a pulse to the vertical charge transfer paths.

3. The solid-state imaging device according to claim 1, wherein the planarizing layer has openings disposed above portions overlapping the wirings with the corresponding kinds of electrodes, and the wirings are electrically connected to the corresponding kinds of electrode at the openings.

4. An imaging apparatus comprising a solid-state imaging device according to claim 1.

* * * * *